United States Patent
Terashima et al.

[11] Patent Number: 5,131,022
[45] Date of Patent: Jul. 14, 1992

[54] EXPOSURE METHOD AND APPARATUS

[75] Inventors: Shigeru Terashima; Mitsuaki Amemiya, both of Atsugi; Isamu Shimoda, Zama; Shunichi Uzawa, Tokyo; Takao Kariya, Hino, all of Japan

[73] Assignee: Canon Kabushiki Kaisha, Tokyo, Japan

[21] Appl. No.: 769,493

[22] Filed: Oct. 1, 1991

Related U.S. Application Data

[63] Continuation of Ser. No. 361,556, Jun. 5, 1989, abandoned.

[30] Foreign Application Priority Data

Jun. 3, 1988 [JP] Japan ................... 63-135616
Sep. 14, 1988 [JP] Japan ................... 63-228389
May 23, 1989 [JP] Japan ................... 1-130682

[51] Int. Cl.$^5$ ............................... G21K 5/00
[52] U.S. Cl. ..................... 378/34; 250/492.2; 430/30
[58] Field of Search ........... 378/34, 54, 56, 156, 378/157, 158, 207; 250/492.24; 355/30, 77, 83, 132; 430/30

[56] References Cited

U.S. PATENT DOCUMENTS 4,707,124 11/1987 Hickey et al. ................ 355/83
4,825,453 4/1989 Kembo et al. ................ 378/34

FOREIGN PATENT DOCUMENTS

0023709 2/1981 European Pat. Off.
2050707 5/1972 Fed. Rep. of Germany.
3712049 11/1987 Fed. Rep. of Germany.
59-203947 11/1984 Japan.

*Primary Examiner*—Janice A. Howell
*Assistant Examiner*—David P. Porta
*Attorney, Agent, or Firm*—Fitzpatrick, Cella, Harper & Scinto

[57] ABSTRACT

An exposure apparatus for lithographically transferring a pattern of a mask onto a workpiece coated with a radiation sensitive material includes a first filter made the same material as of the substrate of the mask, a second filter formed by a base member made of the same material as the mask substrate and being coated with a radiation sensitive material, an illuminometer for measuring illuminance of light passed through the first and second filters, respectively, and a control device for determining an exposure time for lithographic transfer of the pattern of the mask onto the wafer, on the basis of a difference between a measured value as measured through the first filter and a measured value as measured through the second filter.

14 Claims, 7 Drawing Sheets

EXPOSURE METHOD AND APPARATUS

This application is a continuation of prior application, Ser. No. 07/361,556 filed Jun. 5, 1989, now abandoned.

FIELD OF THE INVENTION AND RELATED ART

This invention relates to an exposure method and apparatus for lithographically printing a pattern of an original such as a photomask on a workpiece such as a wafer. More particularly, the invention is concerned with a method and device, usable in such an exposure apparatus, for measuring and controlling the amount of exposure (dose).

With recent further miniaturization of integrated circuits, higher and higher precision is required for the control of resist linewidth after development. In addition thereto, higher and higher uniformness is required for the resist linewidth within an exposure zone.

In order to meet these requirements, not only the precision of mask linewidth and stableness of the developing condition, but also the amount of exposure and uniformness thereof within the exposure zone are very important factors. As a conventional example for dose control, there is a method wherein at plural points within the exposure zone, a measurement is made in preparation to the illuminance of the light irradiating a workpiece such as a wafer and, on the basis of the result of the measurement, the exposure time at each point in the exposure zone is determined.

In this example, however, since usually a resist material and a detector for detecting the illuminance have different spectral sensitivity characteristics, there is a high possibility that, if the exposure time is determined only on the basis of the output of the detector, a sufficient dose necessary for sensitizing the resist material on the workpiece is not obtained or, to the contrary, an excessive dose beyond a correct exposure results.

On the other hand, in an exposure apparatus that uses synchrotron orbit radiation, a fixed mirror or an oscillating mirror is provided to expand the synchrotron radiation beam. In this type of exposure apparatus, there is a large variation in the absolute intensity of X-rays over an exposure zone. Additionally, there is a large difference in wavelength distribution over such exposure zone. Therefore, if the illuminance measurement is made to the radiation beam without taking into account the difference in the wavelength distribution at each point within the exposure zone and if the exposure time at each point is determined on the basis of the output of the detector, there is a high possibility that non-uniformness in exposure not less than ±10% is produced on the wafer surface. This results from the difference in spectral sensitivity characteristics of the resist material and the detector.

In an attempt to solve this problem, a resist may be actually exposed with radiation and, from the result, the X-ray illuminance at each point may be measured. As an example, a method in which a resist is exposed and developed and then the X-ray illuminance measurement is made, has been reported in the Conference of Applied Physics, 1988, Spring, 28p-N-18. However, the dose measurement based on resist exposure involves the following inconveniences:

(a) There is a probe with respect to precision, because, as an example, the developing condition of the resist or the reproducibility directly leads to an error in the exposure time;

(b) In order to increase the precision of measurement, many experiments have to be made and, therefore, a long time is required; and (c) If the exposure wavelength changes due to a change in the orbit of injected electrons or contamination of a beryllium (Be) window, it is necessary to conduct trial printing each time the wavelength changes.

As another important problem in relation to the dose control, there is a possibility of difference in thickness of substrates constituting individual X-ray masks. For example, one representative inorganic series SiN X-ray mask substrate is prepared by a CVD method or otherwise ("Solid State Technology" Vol. 19, Sept. 1976, p.55). Thus, a predetermined thickness cannot always be attained. Such a difference in thickness of the mask substrate results in a possibility of a change in the intensity of a radiation beam passing through the mask.

SUMMARY OF THE INVENTION

In consideration of the foregoing problems, it is an object of the present invention to provide an exposure method and apparatus, wherein such an illuminance by which a resist is to be actually sensitized can be monitored, and wherein on the basis of the result of monitoring an optimum exposure time can be set.

In accordance with one aspect of the present invention, to achieve this object, there is provided an exposure method and apparatus in which an illuminance monitor at an exposure station includes at least such a filter element using a resist material. The result of measurement using such a filter element may be used to ensure an optimum exposure time.

These and other objects, features and advantages of the present invention will become more apparent upon a consideration of the following description fo the preferred embodiments of the present invention taken in conjunction with the accompanying drawings.

DESCRIPTION OF THE PREFERRED EMBODIMENTS

Embodiments of the present invention will be explained, taken in conjunction with the drawings.

Figure 1:
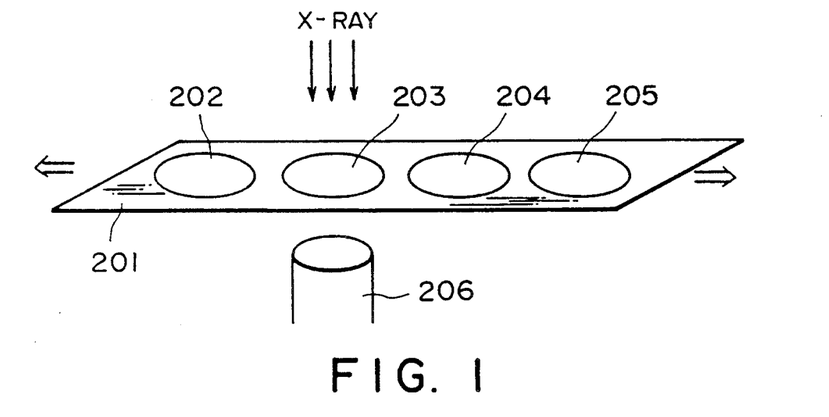
FIG. 1 is a perspective view schematically showing the structure of a filter means usable in an exposure apparatus according to a first embodiment of the present invention.
Figure 2:
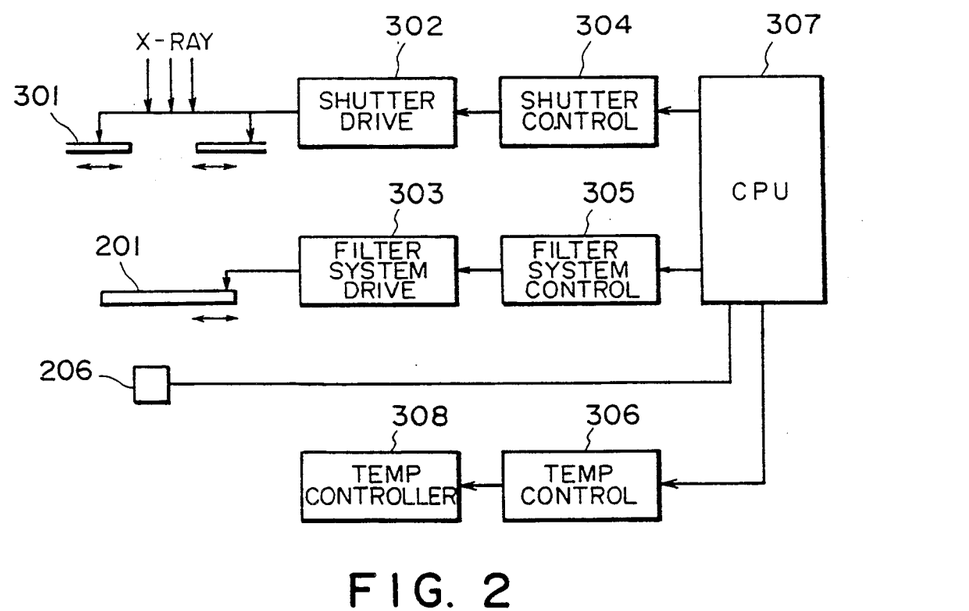
FIG. 2 is a block diagram of the exposure apparatus of the first embodiment.
Figure 3:
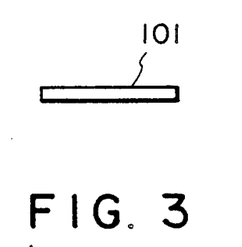
FIGS. 3–5 are schematic representations, showing the structure of the filter means of the FIG. 1 example.
Figure 4:
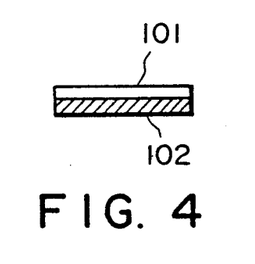
Figure 5:
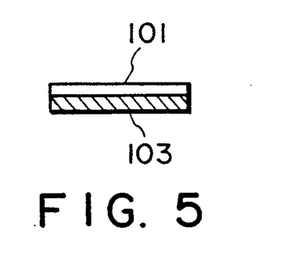

Referring to FIGS. 1-5, the structure of a first embodiment of the present invention will be explained in detail. In FIG. 1, denoted at 201 is a supporting member for supporting plural filters and being movable laterally as viewed in FIG. 1; at 202 is an opening in which no filter is mounted; at 203 is a filter (hereinafter "filter A") such as shown in FIG. 3; at 204 is a filter (hereinafter "filter B") such as shown in FIG. 4; at 205 is a filter (hereinafter "filter C") such as shown in FIG. 5; and at 206 is a sensor.

The filter A shown in FIG. 3 is provided only by a mask substrate material 101; the filter B shown in FIG. 4 is provided by a mask substrate material 101 and an X-ray absorptive material 102; and the filter C shown in FIG. 5 is provided by a mask substrate material 101 and a resist material 103.

FIG. 2 is a block diagram of a measuring system of an exposure apparatus according to the present embodiment. Denoted in FIG. 2 at 301 is a shutter for controlling the exposure time; at 201 is a movable supporting member having plural filters such as shown in FIG. 1; at 206 is a sensor such as an illuminometer mounted to a stage or otherwise (preferably, the sensor is one which shows substantially the same sensitivity characteristic to different wavelength regions); at 302 is a driving means for opening/closing the shutter 301; at 304 is a control means for controlling the driving means 302; at 303 is a driving means for moving the filter supporting member 201; at 305 is a control means for controlling the driving means 303; at 308 is a temperature controller for a mask or a wafer; at 306 is a control means for controlling the temperature controller 308; and at 307 is a central processing unit (CPU) for processing various information from the sensor 206 and for supplying instructions to respectvie control means.

The operation of the exposure apparatus of the present embodiment having the structure shown in FIGS. 1-5, will now be explained. In this embodiment, synchrotron radiation (SOR) X-rays are used as an exposure light source; $Si_3N_4$ of a thickness of 2 microns is used as the mask substrate material 101 (FIGS. 3-5); gold (Au) is used as the mask adsorptive material 102; and a layer of PMMA (polymethyl methacrylate) of a thickness of about 1 micron is used as the resist material 103 (FIG. 4).

In the exposure apparatus of the present embodiment, the supporting member 201 is moved and the illuminance of the radiation beam (X-rays), after passing the opening 202, the filter A, the filter B or the filter C as desired, is measured by means of the sensor 206, on the basis of the result of which an optimum exposure time is set and the temperature control to the mask or wafer is made.

Before explaining the operation in detail, description will be made of various illuminance data and the like that can be detected with the exposure apparatus of the present embodiment.

Figure 6:
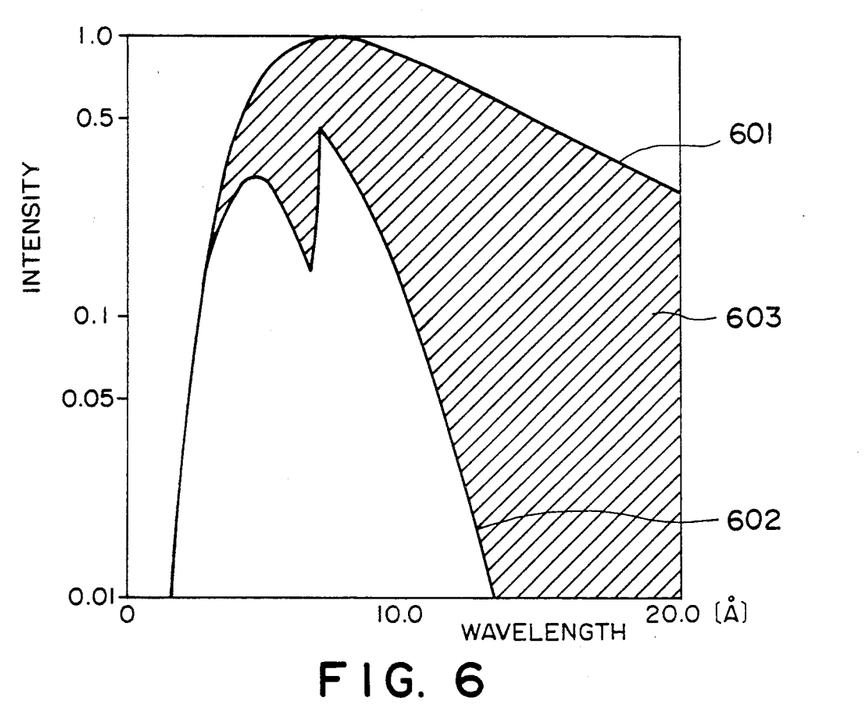
FIGS. 6 and 7 are graphs, each showing the relationship between the wavelength and intensity of X-rays.
Figure 7:
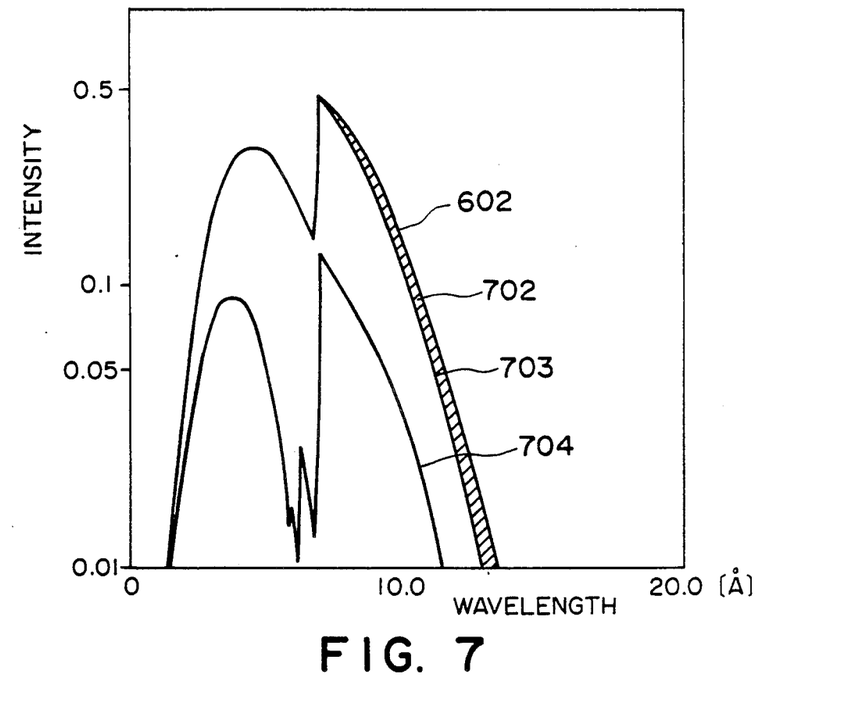

FIGS. 6 and 7 are graphs, each showing the relationship between the wavelength (the axis of the abscissa) and the intensity (the axis of the ordinate) of X-rays. The intensity on the axis of the ordinate depicts the relative intensity where the highest intensity of synchrotron radiation X-rays is represented by 1. Denoted at 601 is an intensity distribution of the synchrotron radiation X-rays. The intensity distribution can be determined by reference to a theoretical intensity at each wavelength which can be obtained by calculation while taking into account the state of energization of the synchrotron radiation beam source at the time of exposure. This is also the case with the intensity distribution which will be referred to in a later part of this Specification. Denoted at 602 is an intensity distribution of X-rays passed through the mask substrate material. To these distributions, in the apparatus of the present embodiment shown in FIGS. 1-5, an integrated value of the intensity distribution 601 corresponds to a measured value of the illuminance passed through the opening 202. Also, an integrated value of the intensity distribution 602 corresponds to a measured value of the illuminance passed through the filter A (mask substrate material 101). By calculation for detecting a difference between the integrated values of the two distributions, the amount of X-ray absorption at the mask substrate material 101 corresponding to a hatched region 603 can be detected. Then, from the integrated value of the intensity distribution 602, the illuminance on the resist surface can be detected and this value of illuminance can be reflected to the exposure time. Also, from the amount of X-ray absorption as detected with the hatched region 603, the amount of heat generation at the mask substrate material 101 can be predicted and, on the basis of which, the temperature control to the mask or wafer can be made.

Further, FIG. 7 shows intensity distributions after passage through the mask absorptive material (at 102 of the filter B) and after passage through the resist material (at 103 of the filter C), respectively. In FIG. 7, denoted at 602 is an intensity distribution which is the same as the intensity distribution 602 (FIG. 6) of the X-rays passed through the mask substrate material. Denoted at 703 is an intensity distribution after passage through a resist material of PMMA, while denoted at 704 is an intensity distribution after passage through a mask absorptive material of Au. Hatched region 702 depicts the amount of absorption of the resist. In the exposure apparatus of the present embodiment having the described structure, these values can be obtained by measurement and they can be reflected to the exposure time control and the temperature control to a mask or wafer. Thus, an optimum exposure time can be ensured and, additionally, temperature control of the mask or wafer can be made.

The operation of the exposure apparatus of the persent embodiment, having the structure shown in FIGS. 1-5, will now be explained in detail.

First, the supporting plate 201 is moved so as to align the opening 202 with the position of the sensor 206 and, by using this sensor 206, the illuminance is measured and the result thereof is memorized into the CPU 307. The illuminance $I_{202}$ at this time can be given by the following equation:

$$I_{202} = \int I_0(\lambda) d\lambda \quad (1)$$

where $I_0(\lambda)$ is the X-ray intensity per unit wavelength as inputted into an exposure room, namely, it corresponds to the intensity distribution curve 601 shown in FIG. 6. Thus $I_{202}$ coppesponds to the area as enclosed by the curve 601 and the X axis in FIG. 6.

Next, the supporting plate 201 is moved and the illuminance after passage through the filter A is measured, the result thereof being memorized into the CPU 307. The illuminance $I_{203}$ at this time can be given by the following equation:

$$I_{203} = \int I_0(\lambda) \cdot e^{-\mu M(\lambda) \cdot tM} d\lambda \quad (2)$$

where $\mu M(\lambda)$ is the ray absorption coefficient of the mask substrate 101, and tM is the thickness or the mask substrate 101. The value $I_{203}$ corresponds to the area as enclosed by the curve 602 and the X axis in FIG. 6, and this value is the illuminance on the resist surface.

By using this value, the CPU 307 supplies an instruction to the shutter control means 304 to thereby control the exposure time. Additionally, by comparison with the result of measurement of the illuminance passed through opening 202, the amount of X-ray absorption at the mask substrate material 101 can be detected.

Namely, the amount of absorption $I_M$ can be given by:

$$\begin{aligned} I_M &= I_{202} - I_{203} \quad (3) \\ &= \int I_0(\lambda) \cdot (1 - e^{-\mu M(\lambda) \cdot tM}) d\lambda \end{aligned}$$

and this corresponds to the area of the hatched region 603 as enclosed by the curves 601 and 602 in FIG. 6. From this, the amount of heat generation at the mask substrate material 106 can be predicted, and the CPU 307 can supply a temperature controlling instruction to the temperature controlling system 306 so that the mask substrate material temperature is converged to a predetermined temperature range.

Next, the supporting plate 201 is moved and the illuminance after passing through the filter B is measured, the result of which is memorized into the CPU 307.

$$I_{204} = \int I_0(\lambda) \cdot e^{-\mu M(\lambda) \, tM} e^{-\mu a(\lambda) \cdot ta} d\lambda \quad (4)$$

where $\mu a(\lambda)$ is the ray absorption coefficient of the mask absorption material 102, and ta is the thickness of the mask absorptive material 102. The value $I_{204}$ corresponds to the area as enclosed by the curve 704 and the X axis in FIG. 7.

By comparison of this result of measurement ($I_{204}$) with the result of measurement ($I_{203}$) through the filter A, the contrast T of the mask at the exposure wavelength can be determined as follows and this value can be used as information for the exposure time control:

$$\begin{aligned} T &= I_{204}/I_{203} \quad (5) \\ &= \frac{[\int I_0(\lambda) e^{-\mu M(\lambda) tM} e^{-\mu a(\lambda) \cdot ta} d\lambda]}{[\int I_0(\lambda) e^{-\mu M(\lambda) \cdot tM} d\lambda]} \end{aligned}$$

Further, by comparison with the result of measurement through the opening 202, the amount of light or X-ray absorption at a site at which the mask absorptive material 102 is present, can be predicted. From this value, the CPU 307 predicts the amount of heat generation and supplies a temperature controlling instruction to the temperature control system 306.

Subsequently, the supporting member 201 is moved and the illuminance after passing through the filter C is measured. The illuminance $I_{205}$ at this time can be given by the following equation:

$$I_{205} = \int I_0(\lambda) e^{-\mu M(\lambda) \, tM} \cdot e^{-\mu R(\lambda) \, tR} d\lambda \quad (6)$$

where $\mu R(\lambda)$ is the ray absorption coefficient of the resist material 103, and tR is the thickness of the resist material 103. The value $I_{205}$ corresponds to the area as enclosed by the curve 703 and the X axis in FIG. 7. By comparison of this result $I_{205}$ with the result of measurement ($I_{203}$) through the filter A, the amount of absorption at the resist material 103 can be predicted and, by using the predicted amount, an optimum exposure time can be determined. This is because of the fact that usually, in the resist materials of the same type, the amount of sensitization can be considered to be proportional to the amount of absorption of light rays contributable to the exposure (sensitization). Particularly, since in the exposure using a wavelength region within the X-ray range, it can be considered that absorbed X-rays emit secondary electrons by which the resist is sensitized, the amount of absorption of X-rays may be regarded as approximately proportional to the amount of sensitization.

The manner of determining an optimum exposure time in accordance with the present invention will now be explained in detail.

The amount De of absorption of the resist, after the exposure, can be expressed in terms of the amount D of absorption of resist per unit time and the exposure time Te, and by the following equation:

$$De = D*Te \quad (7)$$

Also, when the X-ray illuminance data is denoted by Ia, then Te can be written by:

$$Te = Ca/Ia \quad (8)$$

wherein Ia is the effective illuminance which can be written by the following equation:

$$Ia = I_{203} - I_{205} \tag{9}$$
$$= \int I_0(\lambda)e^{-\mu M(\lambda)tM}(1 - e^{-\mu R(\lambda)tR})d\lambda$$

Reference Ca in equation (8) is an optimum exposure amount corresponding to an optimum amount of X-ray absorption by the resist, which is determined by the relationship between the resist sensitivity and the amount of X-ray absorption by the resist, the relationship between the target resist linewidth after development and the resist snesitivity, and the like.

On the basis of the principle of measurement described above, in the FIG. 2 apparatus the exposure time can be determined in the following manner:

$$Te = C/I \tag{10}$$

wherein C is a constant which can be determined by experiments, for example, while taking into account the resist sensitivity, a target resist linewidth after development and the X-ray intensity at the time of exposure. As an example, the constant C may be given by a value X which can be expressed by the following equation:

$$X = Ca \cdot k \tag{11}$$

$(?k = I/Ia)$

In equations (10) and (11), I is a value which is equal to $I_1 - I_2 (I = I_1 - I_2)$, wherein $I_1$ is an output signal of the sensor 206 obtained with measurement throught the filter A and memorized in the CPU 307, and $I_2$ is an output signal of the sensor 206 obtained with measurement through the filter B and memorized in the CPU 307.

The thus determined Te is transmitted to the shutter control means and, by changing the shutter open/close time, an optimum exposure time is obtainable.

Figure 8:
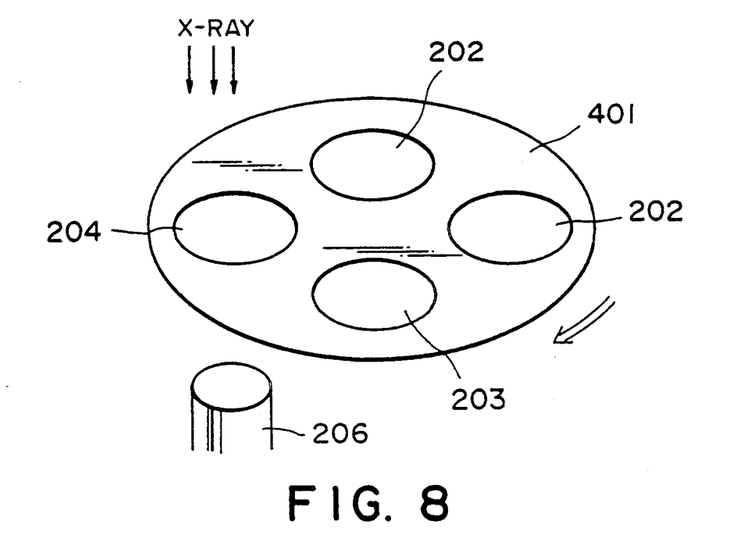
FIG. 8 is a perspective view schematically showing a modified form of the filter means of the FIG. 1 example.

FIG. 8 shows an example wherein the filter supporting member 201 in the exposure apparatus of the foregoing embodiment is replaced by a rotatable plate 401.

Figure 9:
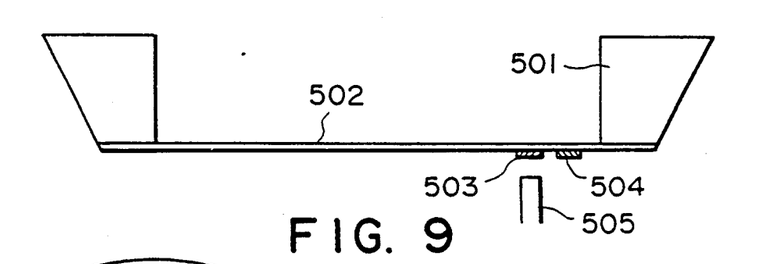
FIG. 9 is a side view schematically showing a further modified form of the filter means of the FIG. 1 example.

FIG. 9 shows an example wherein the filter supporting member 201 of the foregoing embodiment is used also as a mask. Details of this example will be described later. Denoted at 501 is a mask supporting member; at 502 is a mask substrate material; at 503 is a mask absorptive material; at 504 is a resist material; and at 505 is a sensor.

The measuring operation with the structure shown in FIG. 8 or 9 is substantially the same as that made in the forgoing embodiment, and the rotatable plate 401 or the mask supporting member 501 may be moved and each transmitted illuminance may be measured.

Next, a second embodiment of the present invention will be explained.

Figure 13:
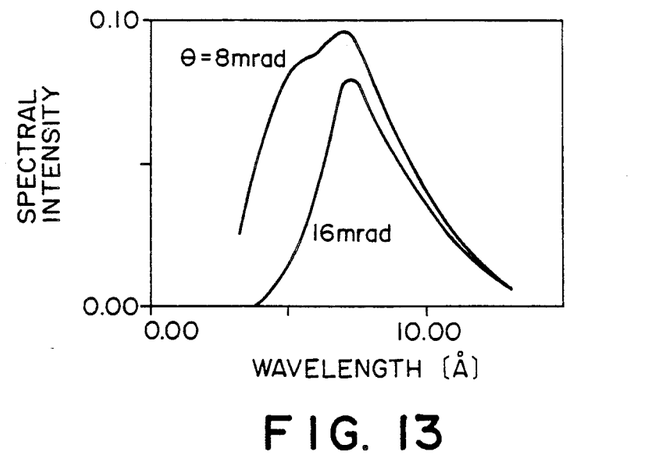
FIG. 13 is a graph of X-ray spectral intensity, by mirror oscillation.
Figure 14:
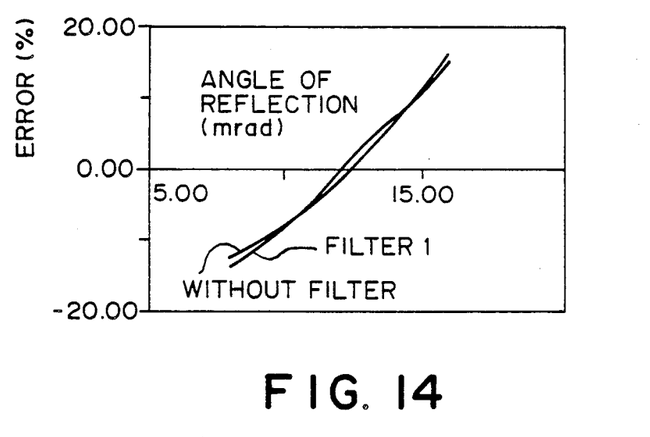
FIG. 14 is a graph illustrating non-uniformness in exposure, in a case where dose control is made by using a conventional measuring method.

In this embodiment, the present invention is applied to an exposure apparatus which uses a mirror oscillation method. The mirror oscillation method is an effective means for enlarging the exposure area wherein, as shwon in FIG. 12, an X-ray mirror 10 is oscillated to oscillatingly deflect, upwardly and downwardly, an X-ray beam of a narrow width from an SR ring 9. Since, however, the spectral reflectance of the X-ray mirror is particularly different depending on the glancing angle θ of the incident X-ray 8, there is a large difference in spectral entensity of X-rays among different exposure position. As an example, spectral intensities of X-rays reflected by a SiC mirror under the condition that the glancing angle θ=8 mrad and the condition that θ=16 mrad, are illustrated in FIG. 13. The axis of the abscissa denotes the wavelength and the axis of the ordinate denotes the X-ray intensity per unit wavelength. Here, the exposure zone is determined by the glancing angle and the disposition of the apparatus and, therefore, the glancing angle may be considered as the exposure position. If, for example, the X-ray mirror 10 is spaced from a wafer by 4 m, in the exposure zone and for 30 mm square, when "θ=8 mrad" corresponds to the upper end of the exposure zone, then the lowere end corresponds to "θ=15.5 mrad". When in such a system an exposure mask of $Si_3N_4$ (of a thickness of 2 microns) and a resist of PMMA (a thickness of 1 micron) are used for the exposure, if, as conventional, no filter is used or the first filter (exposure mask substrate) is used and X-rays passed therethrough are measured by an X-ray illuminance detector 4 and if the values measured at different positions are used as the X-ray illuminance data I to determine the exposure time Te at each position, then the non-uniformness Err in exposure produces an error of ±10% such as shown in FIG. 14. This is because the detector and the resist have different spectral sensitivity characteristics. Such a problem can be solved by the present embodiment, in the manner which will be described below.

Although the present invention is not limited to the exposure using an X-ray region, the following description will be made in relation to the X-ray exposure.

Figures 10, 11, 12:
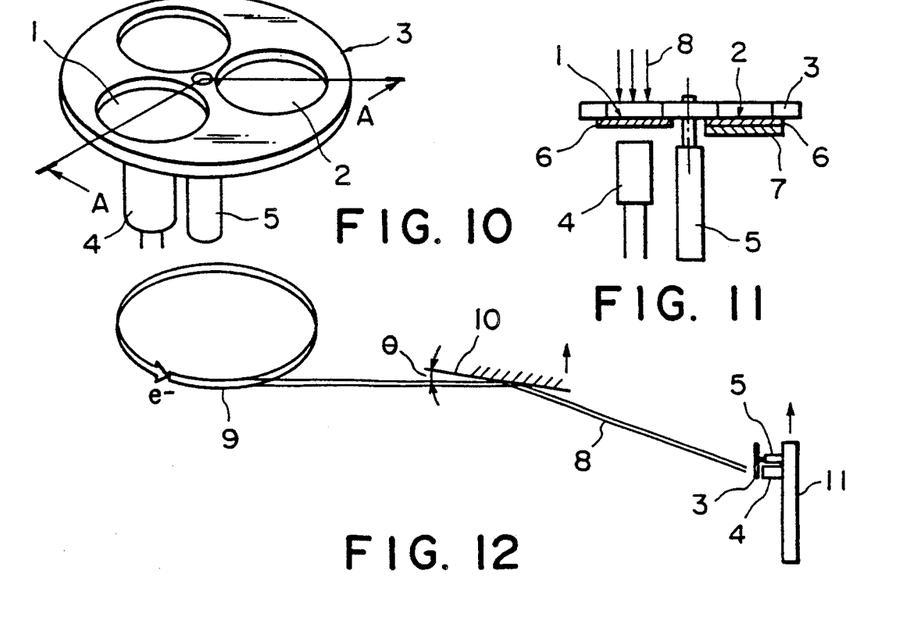
FIG. 10 is a perspective view schematically showing another example of a filter means usable in the present invention.
FIG. 11 is a sectional view taken on a line A—A in FIG. 10.
FIG. 12 is a schematic representation of an exposure apparatus according to a second embodiment of the present invention.
Figure 15:
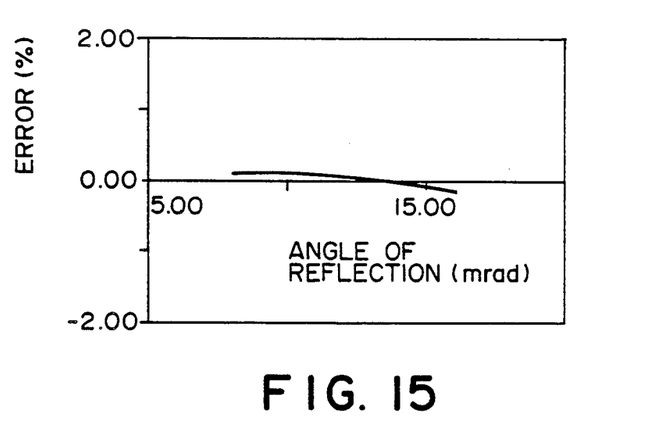
FIG. 15 is a graph illustrating non-uniformness on exposure, in an occasion where dose control is made in accordance with the second embodiment.
Figure 16:
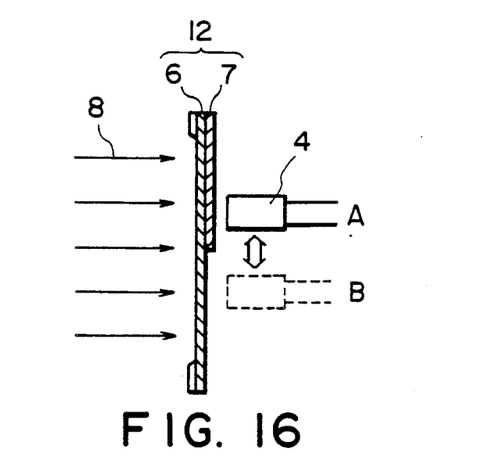
FIG. 16 is a schematic view showing a modified form of the filter means of the second embodiment.
Figure 17:
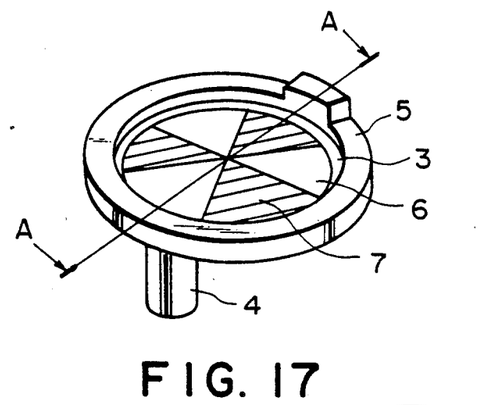
FIG. 17 is a perspective view of a further modified form of the filter means of the second embodiment.
Figure 18:
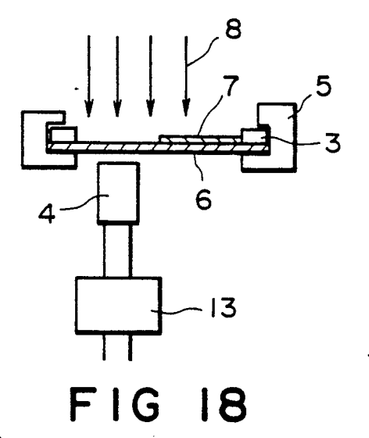
FIG. 18 is a sectional view taken on a line A—A in FIG. 17.

FIG. 10 is a perspective view of an example of the device according to the present embodiment. FIG. 11 is a section taken on a line A—A in FIG. 10. FIG. 12 is a principle view of an exposure apparatus according to the present invention. FIG. 13 is a graph showing a spectral intensity of X-rays in a case of mirror oscillation. FIG. 14 is a representation for illustrating non-uniformness in exposure, according to the prior art. FIG. 15 is a representation illustrating non-uniformness in exposure, according to the present invention. FIGS. 16 and 17 are representations showing different embodiments of the present invention, respectively. FIG. 18 is a section taken on a line A—A in FIG. 17.

In the drawings, denoted at 1 is a first filter comprising a thin film 6 made of the same material as the exposure mask substrate; at 2 is a second filter which is formed by coating a thin film 6, made of the same material as the exposure mask substrate, with a resist 7; at 3 is a filter holder for supporting the first and second filters 1 and 2; and at 4 is an X-ray illuminance detector. The X-ray illuminance detector 4 is communicated with an unshown amplifier and the output is read. Denoted at 5 is a holder driving means which is operable in response to an externally applied signal to rotate the filter 3. Denoted at 8 is an X-ray beam; at 9 is an SR ring; at 10 is an X-ray mirror; at 11 is a stage; at 12 is an X-ray mask; and at 13 is a circuit such as a high-pass filter, for detecting an AC component.

In the described structure, first, as shown in FIG. 10, the stage 11 is moved so that the X-ray illuminance detector 4 comes to a predetermined exposure position, whereby the first filter 1 ($Si_3N_4$ mask substrate of 2 microns in thickness) is set above the X-ray illuminance detector 4. Thereafter, the X-ray mirror 10 is oscillated so that the X-rays 8 pass above the X-ray illuminance detector 4, and through the first filter 1 the intensity of the X-rays 8 is measured. The output thereof is denoted by $I_1$. Then, by using the holder driving means 5, the filter holder 3 is rotated so that the second filter 2 is positioned above the X-ray illuminance detector 4, and through the second filter 2 the X-ray intensity is measured. The output thereof is denoted by $I_2$. The second filter 2 has a structure that a $Si_3N_4$ mask substrate (of a thickness of about 2 microns) is coated with a PMMA resist material of a thickness of about 1 micron. Any difference between the thus measured values $I_1$ and $I_2$, namely, "$I_1-I_2$", is detected and the detected value is used as the X-ray illuminance data I at that position. Subsequently, the stage 11 is moved to repeat the above-described steps, whereby at every exposure position the X-ray illuminance data I is detected. The number of locations for the measurement can be set as described.

By using the thus obtained X-ray illuminance data I(y) and in accordance with equation (10), the exposure time at each exposure position y is determined. Then, the drive speed of the mirror is controlled so that at each exposure position the thus determined exposure time is ensured. By setting the exposure time in this manner, the non-uniformness in exposure of about $\pm 10\%$ can be reduced to a small error not greater than $\pm 0.1\%$, as best seen in FIG. 15.

While in the present embodiment the X-ray illuminance is measured by using the detector 4, the measurement is not limited thereto. For example, it may be measured from a value of electric current at the time of exposure using the SR ring.

As described hereinbefore, it has been confirmed that, by the present invention, a significant improvement is attainable to the non-uniformness in exposure. Further, while the present invention has been described with reference to the mirror oscillation method, the invention is not limited thereto, but is applicable also to a fixed mirror method, for example, and the invention is effective widely to detection of non-uniformness in exposure in an exposure apparatus. Using the fixed mirror method, the X-ray illuminance detector 4 may be fixed and the X-ray illuminance is measured by replacing a filter by another. Alternatively, the filter means may be fixed and the X-ray illuminance detector 4 may be moved continuously and, after the measurement, the X-ray illuminance may be measured while changing filters again. By doing so, an uninterrupted X-ray illuminance distribution is obtainable. Further, it is not always necessary that the thickness of the mask substrate of each filter 1 or 2 and the thickness of the resist layer applied thereto are exactly the same as those of the exposure mask and the resist layer.

Next, description will be made of a third embodiment of the present invention.

While in FIG. 10 there is shown a filter holder 3 having three X-ray transmitting openings, a larger number of filters may be mounted to the filter holder 3. In that case, different mask substrate materials or different resist materials or, alternatively, mask substrate materials or resist materials which are different in thickness may be used as the filters. Further, plural X-ray illuminance detectors which are calibrated in a direction with respect to which they have the same X-ray spectral intensity, namely, those calibrated with respect to a horizontal direction, may be provided and X-ray illuminance passed through the filters 1 and 2 may be measured at the same time.

As shown in FIG. 16, a half of the surface of a mask (dummy mask) having no pattern may be coated with a resist material and measurement may be made by using an X-ray illuminance detector to the side (at A in the drawing) coated with the resist and to a side (at B in the drawing) not coated with the resist. By detecting a difference between measured values, the X-ray illuminance data I is obtainable. In this embodiment, it is important that the measurement is made to avoid changes in the X-ray spectral intensity, depending on the positions A and B. To this end, in the mirror oscillation method or the fixed mirror method, it is possible to place the positions A and B in the same horizontal direction. Further, without moving the X-ray illuminance detector 4, the mask 12 may be moved. Moreover, different types of resist materials or plural resist layers different in thickness may be applied to a single mask substrate. In that case, the resist materials may be applied to the front and back surfaces of one and the same mask substrate. In accordance with this embodiment, there is no necessity of preparing specific means such as a filter, a filter holder and the like, and the measurement is attainable only by the mask change.

FIGS. 17 and 18 illustrate a fourth embodiment of the present invention. As illustrated, a filter of such structure that a resist material is selectively applied to one thin film, is attached to a filter holder 3 which can be rotated by a filter driving means 5, whereby X-rays passing through a portion coated with the resist and a portion not coated with the resist are alternately incident on the X-ray illuminance detector, such that two different X-ray illuminance signals are alternately produced. The X-ray illuminance detector is coupled to a circuit 13 such as, for example, a high-pass filter, having a function for detecting a difference in illuminance between those X-ray beams. With the detector of such structure, it is possible to continuously and quickly detect the X-ray illuminance difference by moving the detector unit (an integral assembly of the detector 4, the filter holder 3, the driving means and the like). Alternatively, by individual measurements and subsequent detection of the difference, high-precision detection of the intensity difference is attainable.

In the foregoing embodiment, description has been made on the assumption that the X-ray illuminance does not change during measurement of the non-uniformness in intensity. However, if the half life of the electron beam is short, there is a possibility that the X-ray illuminance is attenuated during the measurement. On such an occasion, it is possible to correct a measured value I(y). As for the correction, there are a method based on calculation and a method based on measurement. In the method based on measurement, a separate detector (output Ip) may be used to measure any attenuation of the X-ray illuminance during measurement of the non-uniformness in intensity, and the result may be fed back to the X-ray illuminance data I(y) to correct the same. For example, when Ip is measured at a fixed position, if the X-ray illuminance data at the position y is denoted by I(y) and the X-ray illuminance at the time of measurement is denoted by Ip(y), then true X-ray illuminance data It(y) can be expressed by the following equation:

$$It(y) = I(y) * (Ip(o)/Ip(y)) \tag{10}$$

Further, the correction may be made electrically. For example, Ip may be applied as a denominator input for a dividing circuit while I(y) may be applied as a numerator input. By doing so, as an output of the dividing circuit, the data It(y) is obtainable. Further, while there may be some ways for the method based on calculation, for example, where the life time of the electron beam is denoted by $\tau$, where the time upon start of measurement of the X-ray illuminance data is denoted by 0 and where the time of measurement at the position y is denoted by t, then the correction may be made in the following manner:

$$It(y) = I(y) * exp(t/\tau) \qquad (11)$$

Next, a fifth embodiment of the present invention will be described. With reference to the foregoing embodiments, too, explanation has been made to a general structure in which the filter means is formed as a unit with an exposure mask. In this embodiment, however, this will be explained in greater detail.

Figure 19:
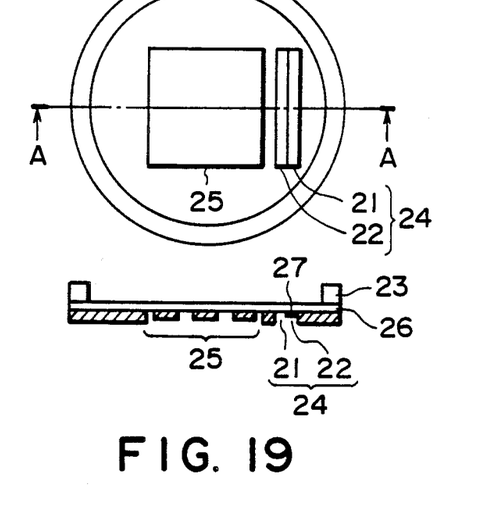
FIG. 19 is a representation of an X-ray mask according to a third embodiment of the present invention.

FIG. 19 is a schematic representation showing an X-ray mask according to the fifth embodiment. Denoted at 23 is a ring-like supporting member; at 25 is a region for a pattern to be transferred to a wafer; at 24 is a region for a pattern for measurement of illuminance of the exposure light (namely, the illuminance measuring window); at 26 is a membrane (thin film) for supporting the transfer pattern or the like and being held by the ring-like supporting member 23; at 21 is a first region to which no resist has been applied; and at 22 is a second region to which a resist has been applied.

As illustrated, outside the ordinary exposure region 25, a region having no absorptive material, namely, the intensity measuring window 24 is provided. This window comprises the second region 22 to which a resist 27 for use in the exposure has been applied, and the second region 21 to which no resist has been applied.

Figure 20:
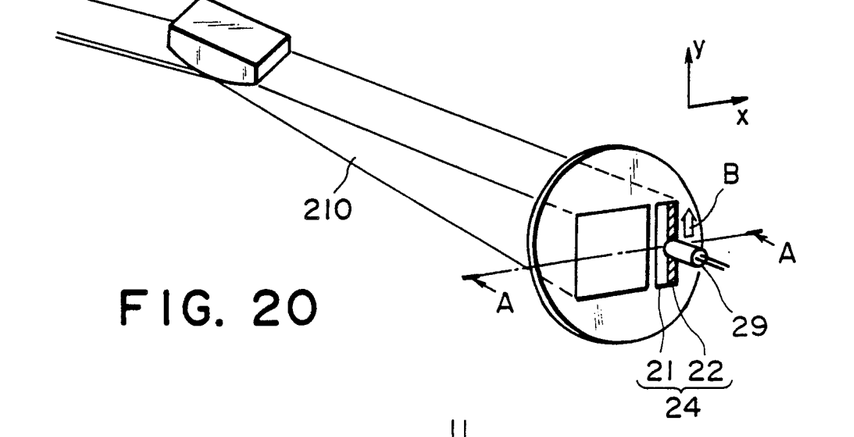
FIG. 20 is an explanatory view, explaining measurement of exposure illuminance by using the X-ray mask of the third embodiment.

FIG. 20 is a perspective view showing a major portion of the structure, wherein the X-ray mask of FIG. 19 is used for measurement of the exposure illuminance.

Figure 21:
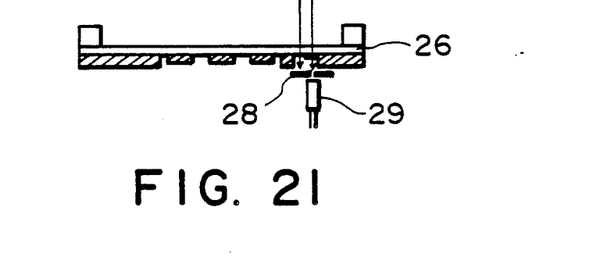
FIG. 21 is a sectional view taken on a line A—A in FIG. 19.
Figure 22:
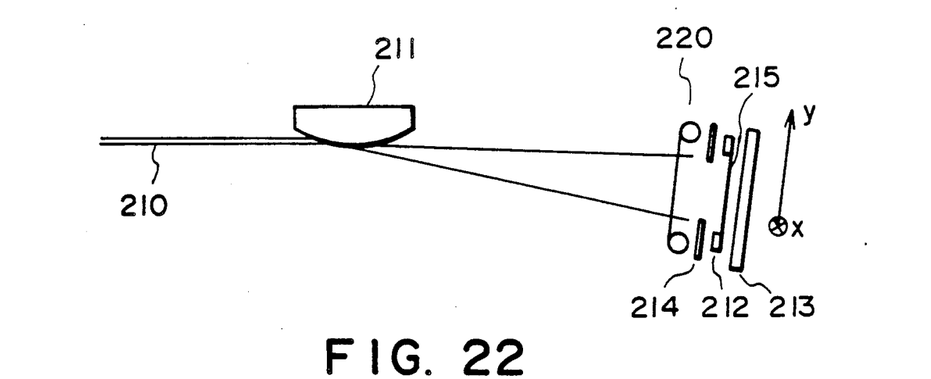
FIG. 22 is a schematic representation, showing an exposure apparatus in which an X-ray mask according to the third embodiment is used.

FIG. 21 is a section taken on a line A—A in FIG. 20. FIG. 22 is a schematic representation showing an arrangement in which the X-ray mask of the present embodiment is incorporated into an exposure apparatus. Denoted at 210 is a synchrotron radiation beam which is an exposure light (sensitizing light); at 211 is a mirror; at 212 is an X-ray mask supporting holder; at 213 is an X-Y stage for moving a workpiece such as a wafer, for example; at 214 is a blocking plate; at 215 is an X-ray mask; and at 220 is a dose controlling shutter.

Figure 23:
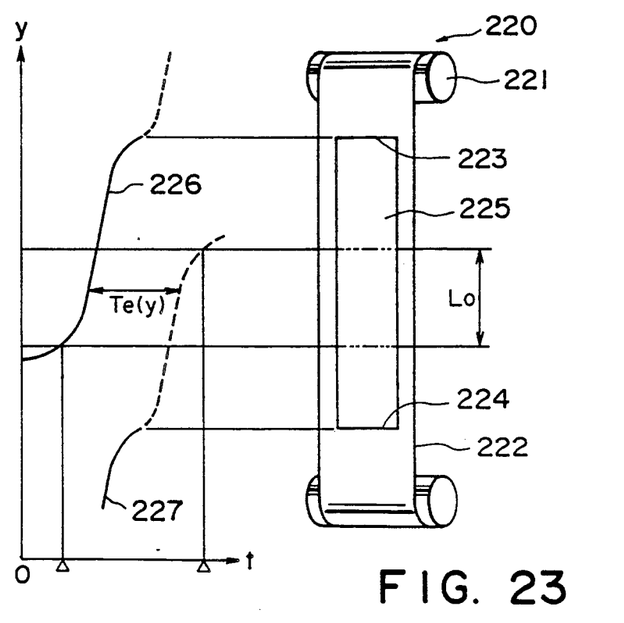
FIG. 23 is a schematic view for explaining the structure of a shutter means in the exposure apparatus of FIG. 22.

FIG. 23 is an enlarged schematic view showing the structure of the shutter for controlling the amount of exposure (dose) in the exposure apparatus.

X-ray illuminance detector 29 is disposed behind the second region 22 of the illuminance measuring window 24, coated with the resist, and then it is scanned in the direction of an arrow B in FIG. 20 and, during the scan, at each point the X-ray illuminance $I_2(y)$ passed through the resist 27 and the mask substrate 26 is measured. Subsequently, the X-ray illuminance detector 29 is moved to the back of the first region 21 having no resist coating and, thereafter, the scan is made in a similar manner, and at each point the X-ray illuminance $I_1(y)$ passed through the mask substrate 26 is measured. Subsequently, for each point y, the following calculation is made:

$$I(y) = I_1(y) - I_2(y) \qquad (12)$$

and the result of calculation is taken as the X-ray oilluminance data I(y) at that point.

Then, by using the thus obtained I(Y), and by the calculation described hereinbefore, the exposure time Te(y) at each exposure position y is determined. Subsequently, the speed of the shutter 220 (FIG. 22) is controlled so that at each exposure position y the exposure time Te(y) as determined above is assured.

During measurement of the illuminance, the blocking plate 214 is introduced to prevent the wafer 213 from being irradiated with X-rays. At the time of exposure, on the other hand, the blocking plate 14 is adjusted so that the illuminance measuring window is not transferred to the wafer. The function of the blocking plate 214 may be provided by the shutter 220. If this is desired, then it is necessary to provide a shutter belt 222 with an illuminance measuring aperture, in addition to the exposure aperture 225, which measuring aperture allows that only the illuminance measuring window 24 receives X-rays.

While in the foregoing, description has been made of an arrangement wherein an X-ray beam expanded by a convex mirror 211 is projected on the whole surface of the mask at a time, the invention is not limited to such an exposure process. For example, the invention is effectively applicable to a mirror oscillation exposure process. In that case, the X-ray illuminance detector 29 may be fixed at a position behind the first region 21 of the illuminance measuring window 24 and, while oscillating the mirror, a detector output $I_1(y)$ may be detected. Subsequently, the X-ray illuminance detector may be moved to the back of the second region to detect $I_2(y)$ and, in accordance with equation (9), measurement may be made to obtain I(y).

Next, another exampale of the method of measurement using a mask of the present embodiment will be explained.

In the measurement of this example, by oscillating the X-ray illuminance detector 29 in the X direction in FIF. 21, X-rays passed through the respective regions 21 and 22 can be alternately incident on the detector 29. In that case, the detector 29 produces alternate outputs of $I_1(y)$ and $I_2(y)$. Therefore, the AC component provides the X-ray illuminance data at the measurement position Y. In this example, since the X-ray illuminance data I(y) is directly obtainable, there is no necessity of calculation such as in equation (9). Also, the measurement precision will be enhanced.

Figure 24:
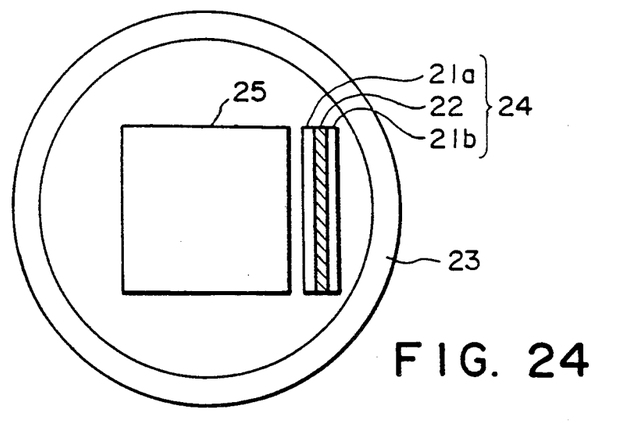
FIG. 24 is a representation showing a modified form of the third embodiment.
Figure 25:
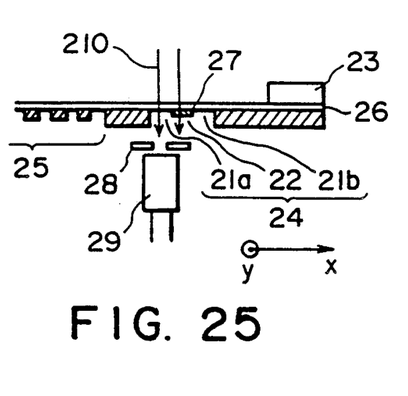
FIG. 25 is a sectional view of the X-ray mask of the FIG. 24 example.

Referring now to FIG. 24, description will be made of an applicable example of the present embodiment. In this example, the illuminance measuring window 4 is formed by a second region 22 having a resist coating 27 and two regions 21a and 21b disposed on the opposite sides of the region 22 and having no resist coating. FIG. 25 is a section of the structure of the FIG. 24 example, illustrating the measurement. In the mask structure of this example, the illuminance measurement is made by scanning the X-ray illuminance detector 29 in the X-direction such that the X-ray illuminance detector 29 can receive, in sequence, X-rays passed through the regions 21a, 22 and 21b, respectively. By using the signals $I_{1a}(y_0)$, $I_2(y_0)$ and $I_{1b}(y_0)$ obtained in this manner, and by using $I_1(y_0)$ in equation (1) as an average of $I_{1a}(y_0)$ and $I_{1b}(y_0)$, the X-ray illuminance data $I(y_0)$ is detected. Namely:

$$I(y_0) = \tfrac{1}{2}[I_{1a}(y_0) + I_{1b}(y_0)] - I_2(y_0) \qquad (13)$$

Subsequently, the X-ray illuminance detector 29 is displaced in the y direction by $\Delta y$ and, by executing the measurement in a similar manner, X-ray illuminance data I(y₀+Δy) at the position y+Δy is obtainable.

By substituting the thus obtained X-ray illuminance data I(y) into equation (8), the exposure time Te(y) at each position is determined and, on the basis of which, the shutter is driven.

Figure 26:
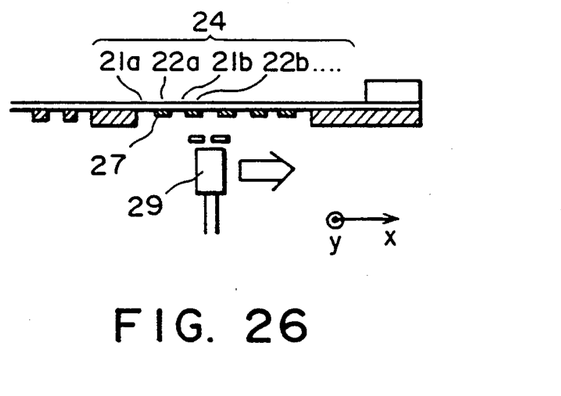
FIG. 26 is a representation showing a further modified form of the third embodiment.

FIG. 26 shows a further applicable example of the present embodiment. In this example, the illuminance measuring window 24 comprises resist materials 27 of different proportions, which have been applied each in a stripe fashion, such that first regions and second regions are arrayed alternately. In the measuring operation, such a resist material to be used in the exposure is selected out of the second regions to which the resist materials have been applied, and by using the selected region and a first region adjacent thereto, the measurement is made essentially in the same manner as having been described.

In this example, as described, different resist materials are applied to a single illuminance measuring window. However, plural illuminance measuing windows may be provided.

In the structure described above, X-ray illuminance data corresponding to different resist materials is obtainable by using a single X-ray mask. Therefore, it is possible to meet the change of a resist material to be used in the exposure.

While the invention has been described with reference to the structure disclosed herein, it is not confined to the details set forth and this application is intended to cover such modifications or changes as may come within the purposes of the improvements or the scope of the following claims.

What is claimed is:

1. An exposure apparatus for lithographically transferring a pattern of a mask onto a workpiece coated with a radiation sensitive material, comprising:
   a filter having a radiation sensitive material;
   an illuminometer for measuring illuminance of light passed through said filter; and
   control means for setting an exposure time for the lithographic transfer of the mask pattern to the workpiece, on the basic of an output of said illuminometer.

2. An exposure apparatus for lithographically transferring a pattern of a mask onto a workpiece coated with a radiation sensitive material, comprising:
   a first filter made of the same material as the substrate of the mask;
   a second filter formed by a base member made of the same material as the mask substrate and being coated with a radiation sensitive material;
   illuminometer for measuring illuminance of light passed through said first and second filters, respectively; and
   control means for determining an exposure time for lithographic transfer of the pattern of the mask onto the wafer, on the basis of a difference between a measured value as measured through said first filter and a measured value as measured through said second filter.

3. An apparatus according to claim 2, wherein said first and second filters are movable relative to an exposure zone.

4. An apparatus according to claim 2, wherein said light comprises X-rays.

5. An exposure apparatus for printing a pattern on a substrate with radiation, said apparatus comprising:
   a holder for holding a member on a path of the radiation, the member having a first portion coated with a radiation sensitive material sensitive to the radiation and a second portion not coated with the radiation sensitive material;
   detecting means for detecting the radiation passed through the first portion of the member and the radiation passed through the second portion of the member; and
   control means for controlling exposure of the substrate with the radiation on the basis of the detection by said detecting means.

6. An apparatus according to claim 5, wherein the member has the pattern formed thereon.

7. An apparatus according to claim 5, wherein said detecting means is movably supported along the member.

8. An exposure apparatus for printing a pattern, formed on a mask substrate, on a workpiece with radiation, said apparatus comprising:
   a holder for holding a sheet-like member on a path of the radiation, the member being made of the same material as the mask substrate and having an opening;
   detecting means for detecting the radiation passed through the sheet-like member and the radiation passed through the opening of the sheet-like member; and
   control means for controlling temperature of at least one of the mask substrate and the workpiece during exposure of the workpiece to the mask substrate with the radiation.

9. An apparatus according to claim 8, wherein the sheet-like member has a coating of a radiation sensitive material sensitive to the radiation, and wherein said detecting means detects the radiation passed through the radiation sensitve material coating.

10. An exposure apparatus for printing a pattern on a substrate with radiation, said apparatus comprising:
    a holder for holding a member on a path of the radiation, the member having a coating of a radiation sensitive material sensitive to the radiation;
    detecting means for detecting the radiation passed through the member; and
    control means for controlling exposure of the substrate with the radiation on the basis of the detection by said detecting means.

11. An apparatus according to claim 10, wherein said holder selectively holds the member on and off the path of radiation.

12. An apparatus according to claim 10, wherein the member has the pattern formed thereon.

13. An apparatus according to claim 10, wherein said detecting means detects the radiation passed through the radiation sensitive material coating.

14. An apparatus according to claim 10, wherein said detecting means is movably supported along the member.

* * * * *

UNITED STATES PATENT AND TRADEMARK OFFICE
CERTIFICATE OF CORRECTION

PATENT NO. : 5,131,022
DATED : July 14, 1992
INVENTOR(S) : Shigeru Terashima, et al.

It is certified that error appears in the above-identified patent and that said Letters Patent is hereby corrected as shown below:

ON THE TITLE PAGE

IN THE ABSTRACT

Line 3, "made" should read --made of--; and
Line 4, "of" should be deleted.

COLUMN 1

Line 67, "probe" should read --problem--.

COLUMN 2

Line 37, "fo" should read --of--.

COLUMN 5

Line 24, "coppesponds" should read --corresponds--.

UNITED STATES PATENT AND TRADEMARK OFFICE
CERTIFICATE OF CORRECTION

PATENT NO. : 5,131,022
DATED : July 14, 1992
INVENTOR(S) : Shigeru Terashima, et al.

It is certified that error appears in the above-identified patent and that said Letters Patent is hereby corrected as shown below:

COLUMN 7

Line 12, "snesitivity," should read --sensitivity,--;
Line 27, "(?k=I/Ia)" should read --(∴k=I/Ia)--;
Line 31, "throught" should read --through--;
Line 66, "entensity" should read --intensity--; and
Line 67, "position." should read --positions.--.

COLUMN 11

Line 65, "oil-" should read --il- --.

COLUMN 13

Line 57, "illuminometer" should read --an --illuminometer--.

Signed and Sealed this

Twenty-first Day of September, 1993

Attest:

BRUCE LEHMAN

*Attesting Officer*      *Commissioner of Patents and Trademarks*